United States Patent
Kumashiro et al.

(10) Patent No.: US 7,700,185 B2
(45) Date of Patent: Apr. 20, 2010

(54) INSULATION MATERIAL, FILM, CIRCUIT BOARD AND METHOD OF PRODUCING THEM

(75) Inventors: Yasushi Kumashiro, Chikusei (JP); Yoshitaka Hirata, Chikusei (JP); Shin Takanezawa, Chikusei (JP); Yasushi Shimada, Tsukuba (JP); Kazuhisa Otsuka, Chikusei (JP); Hiroyuki Kuriya, Chikusei (JP); Kazunori Yamamoto, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 636 days.

(21) Appl. No.: 10/557,890

(22) PCT Filed: May 19, 2004

(86) PCT No.: PCT/JP2004/007150

§ 371 (c)(1),
(2), (4) Date: Nov. 18, 2005

(87) PCT Pub. No.: WO2004/102589

PCT Pub. Date: Nov. 25, 2004

(65) Prior Publication Data

US 2007/0060672 A1    Mar. 15, 2007

(30) Foreign Application Priority Data

| May 19, 2003 | (JP) | ............................ 2003-140704 |
| May 19, 2003 | (JP) | ............................ 2003-140714 |
| Jun. 6, 2003 | (JP) | ............................ 2003-162001 |

(51) Int. Cl.
*B32B 5/16* (2006.01)
*B32B 15/04* (2006.01)
*C08K 7/00* (2006.01)
*C08K 3/22* (2006.01)

(52) U.S. Cl. ...................... 428/323; 428/457; 523/220; 524/413; 524/497

(58) Field of Classification Search ........................ None
See application file for complete search history.

(56) References Cited

U.S. PATENT DOCUMENTS

| 5,079,069 A | 1/1992 | Howard et al. |
| 6,329,058 B1 * | 12/2001 | Arney et al. ................. 428/403 |
| 6,910,266 B2 * | 6/2005 | Lee et al. ...................... 29/832 |
| 7,220,481 B2 * | 5/2007 | Satsu et al. .................. 428/328 |
| 2002/0168510 A1 | 11/2002 | Satsu et al. |

FOREIGN PATENT DOCUMENTS

| GB | 1047439 | 11/1966 |
| JP | 53-088198 | 8/1978 |
| JP | 06-196862 | 7/1994 |
| JP | 06-200216 | 7/1994 |
| JP | 06-329998 | 11/1994 |
| JP | 07-165949 | 6/1995 |
| JP | 08-133732 | 5/1996 |
| JP | 2000-030966 | 1/2000 |
| JP | 2000-053875 | 2/2000 |
| JP | 2001-214097 | 8/2001 |
| JP | 2001-233669 | 8/2001 |
| JP | 2001-237507 | 8/2001 |
| JP | 2001-308250 | 11/2001 |
| JP | 2002-100238 | 4/2002 |
| JP | 2002-185146 | 6/2002 |
| JP | 2002-265797 | 9/2002 |
| JP | 2004-307607 | 11/2004 |

OTHER PUBLICATIONS

Translation of the International Preliminary Report on Patentability, for International Application No. PCT/JP2004/007150, dated Mar. 9, 2006.
Taiwanese Official Action issued May 5, 2009, for Application No. 93113980.
Japanese Official Action issued Jun. 9, 2009, for Application No. 2005-506300.

* cited by examiner

*Primary Examiner*—Sheeba Ahmed
(74) *Attorney, Agent, or Firm*—Antonelli, Terry, Stout & Kraus, LLP.

(57) ABSTRACT

There is provided an insulation material having a dielectric constant of 10 or more, comprising a filler having a dielectric constant of 50 or more and having two peaks in different particle size ranges in a particle size distribution and an insulating resin combined with each other; an insulation material having a dielectric constant of 10 or more comprising, as essential components, 1) at least one filler selected from the group consisting of barium titanate, strontium titanate, potassium titanate, magnesium titanate, lead titanate, titanium dioxide, barium zirconate, calcium zirconate and lead zirconate, 2) an insulating resin and 3) a dispersant containing a carboxylic group; or an insulation material comprising a filler having a dielectric constant of 50 or more, a dispersant for dispersing the filler and an insulating resin as essential components, wherein an extract of a cured product of the insulation material obtained by extraction with water at 120° C. for 20 hours using a pressure vessel has a pH of 6 or higher.

49 Claims, No Drawings

INSULATION MATERIAL, FILM, CIRCUIT BOARD AND METHOD OF PRODUCING THEM

TECHNICAL FIELD

The present invention relates to an insulation material which can have a high dielectric constant and be thinned and is suitable as a material of a condenser embedded in a substrate, a film, a circuit board and a method of producing the same.

BACKGROUND ART

Recently, in response to the demand of miniaturization and lightweight of electronic appliances, thinner and higher density circuit boards are being developed. In particular, for electronic appliances used in the fields of information/communication and information processing, higher performance is strongly demanded. Thus, a need for acquiring areas for mounting high performance parts is growing.

Up to present, to ensure such mounting areas, miniaturization of surface mounting parts, narrowing of terminal pitches, fine pattern of substrates, SMT (Surface Mount Technology) in which parts are mounted on a substrate surface at a high density and Advanced SMT which is an upgraded version thereof have been studied.

Recently, however, passive devices (capacitors, inductors and registers) responsible for electrical control occupies more than half of the mounting area compared to active devices (chip parts) contributing to higher function, and this has prevented progress of miniaturization and higher function.

Thus, development of "substrate with embedded passive devices" in which functions of passive devices are built within a substrate is required. In particular, regarding embedding of capacitors which account for more than half of the passive devices, utilization of an insulating layer as a dielectric of a capacitor has been proposed. By integrating functions of passive devices within a substrate, soldered joints conventionally used for electrical connection between surface mounting parts and wiring boards are no longer present. It is thus expected that reliability is improved and more flexible circuit design becomes possible. In addition, it is expected that since integration makes it possible to form a passive device at an effective position, wire length can be shortened and as a result, parasitic capacitance is reduced and electrical properties are improved. Moreover, because surface mounting is unnecessary, cut down of costs is expected.

The capacitance which is the performance of an embedded capacitor is represented by the following formula, and to improve the capacitance, higher dielectric constant of an insulating layer and thinning of an insulating layer are effective.

$$C = \epsilon \cdot \epsilon_r \cdot A/t \quad \text{(formula 1)}$$

In the formula, C: capacitance (F), $\epsilon$: dielectric constant in vacuum (8.85 F/m), $\epsilon_r$: relative dielectric constant of insulating layer, A: electrode area (m$^2$) and t: thickness of insulating layer (m).

As an insulating layer for a printed wiring board, glass cloth prepregs produced by impregnating glass cloth with resin, drying the same and semi-curing the resin have been conventionally used. For multi-layered printed wiring boards, in addition to such glass prepregs, prepregs without glass cloth, i.e., adhesive films obtained by semi-curing resin capable of forming film, are used. These are disclosed, for example, in Japanese Patent Application Laid-Open Nos. 6-200216 and 6-329998. Further, for multi-layered printed wiring boards, an adhesive film with copper foil in which the above adhesive film is formed on one side of copper film is used. This is disclosed, for example, in Japanese Patent Application Laid-Open No. 6-196862.

Conventionally, glass cloth impregnated with thermosetting resin such as epoxy resin or insulating resin coated on copper foil has been generally used. These materials have a dielectric constant of about 3 to 5. Methods of using such materials as a dielectric of an embedded capacitor have been proposed, and disclosed, for example, in U.S. Pat. No. 5,079,069. The dielectric constant, however, was in the single digits as described above. In addition, to increase the capacitance of a capacitor, the thickness of an insulating layer must be reduced.

To achieve thinning of prepregs composed of glass cloth, the thickness of the glass cloth itself, which is a base material, needs to be reduced. At present, thin glass cloths of about 20 µm are available on market, but they have a problem in production that their strength is decreased due to thinning and so the base material is easily broken upon coating. Further, since the cloth is impregnated with resin and then used as an insulating layer, the resultant becomes thicker than the original base material after impregnation, and thinning has thus reached its limit.

Semi-cured adhesive film, which is a prepreg without glass cloth, is generally composed of an organic insulation material containing a thermosetting component. Although thinning of this prepreg is easier than that of a prepreg composed of glass cloth, improvement of dielectric constant was difficult.

As a technique for increasing dielectric constant, for example, an insulation material in which an inorganic filler having a relatively high dielectric constant is combined with an organic material has been studied. It has also been reported that high dielectric constant is achieved by using spherical inorganic filler having an average particle size of 20 µm or 40 µm. This is disclosed, for example, in Japanese Patent Application Laid-Open No. 53-88198. However, despite the effort of thinning of the composite material in order to improve the capacitance, thinning was difficult because the inorganic filler had a large particle. In addition, use of particles having a sufficiently small particle size causes problems that thixotropic properties of varnish upon forming a composite are increased and thus a uniform insulating layer cannot be obtained. Further, in the case of high volume filling of filler for improvement in dielectric constant, resin is not sufficiently mixed with the filler and voids and defects are generated, and this has resulted in problems that dielectric constant is not increased and such defects have a bad effect on reliability and the like upon use as an insulation material.

DISCLOSURE OF THE INVENTION

A first embodiment of the present invention relates to an insulation material having a dielectric constant of 10 or more, comprising a filler having a dielectric constant of 50 or more and having two peaks in different particle size ranges in a particle size distribution and an insulating resin combined with each other.

A second embodiment of the present invention relates to an insulation material having a dielectric constant of 10 or more comprising, as essential components, 1) at least one filler selected from the group consisting of barium titanate, strontium titanate, potassium titanate, magnesium titanate, lead titanate, titanium dioxide, barium zirconate, calcium zirconate and lead zirconate, 2) an insulating resin and 3) a dispersant containing a carboxylic group.

A third embodiment of the present invention relates to an insulation material comprising a filler having a dielectric constant of 50 or more, a dispersant for dispersing the filler and an insulating resin as essential components, wherein an extract of a cured product of the insulation material obtained by extraction with water at 120° C. for 20 hours using a pressure vessel has a pH of 6 or higher.

In the first embodiment, the filler having a dielectric constant of 50 or more preferably comprises two fillers having different particle sizes at a cumulative percentage of 50%. More preferably, the filler having a dielectric constant of 50 or more comprises two fillers having different particle sizes at a cumulative percentage of 50% so that the particle size at a cumulative percentage of 50% is 1 to 3 µm. Further, the two fillers preferably comprise a filler having a dielectric constant of 50 or more having a particle size of 1 to 5 µm at a cumulative percentage of 50% and a filler having a dielectric constant of 50 or more having a particle size of 0.01 to 1 µm at a cumulative percentage of 50%. Further, the filler preferably contains 50% by weight or more of a filler having a particle size of 1 to 5 µm at a cumulative percentage of 50% based on the total amount of the fillers, and a remaining filler having a particle size of 0.01 to 1 µm at a cumulative percentage of 50%.

In the second embodiment, the dispersant containing a carboxylic group may be a copolymer containing a carboxylic group.

In the first to third embodiments, the content of the filler having a dielectric constant of 50 or more may be 30 to 90 parts by volume based on 100 parts by volume of the insulation material.

In the first to third embodiments, the filler may be at least one member selected from the group consisting of barium titanate, strontium titanate, potassium titanate, magnesium titanate, lead titanate, titanium dioxide, barium zirconate, calcium zirconate and lead zirconate.

In the first to third embodiments, the insulating resin may contain a high molecular weight component having a weight average molecular weight of 10000 or more and capable of forming a film and a thermosetting component. The insulating resin contains 5 to 95% by weight of the high molecular weight component. The high molecular weight component is preferably at least one component selected from the group consisting of a phenoxy resin, polyamideimide resin, polyacrylonitrile resin, polyphenyleneoxide resin and polyacrylonitrile butadiene resin. The thermosetting component preferably contains an epoxy resin and a phenol resin which is a curing agent thereof.

In addition, an insulation material according to the first to third embodiments may be applied to a metal foil to form a film bondable by thermocompression bonding, and the applied insulation material may be semi-cured. The insulation material may also be applied to a plastic film carrier to form a film bondable by thermocompression bonding, and the applied insulation material may be semi-cured. Further, a film having a conductive layer on both sides of an insulation material may also be formed, and in that case, the insulation material may be cured.

In addition, a circuit board comprising an insulation material according to the first or second embodiment as an insulating layer or a thermosetting insulating layer of 3 to 100 µm may be formed. A circuit board comprising an insulation material according to the third embodiment as an insulating layer or a thermosetting insulating layer of 3 to 100 µm, preferably 10 to 100 µm may be formed.

An embodiment of the present invention also relates to a method of producing a circuit board, which comprises applying the above-described insulation material to a circuit board, thereby forming an insulating layer. The method may also comprise a thermosetting step.

An embodiment of the present invention also relates to a method of producing an insulation material with metal foil on both sides, which comprises bonding another metal foil to a resin surface without a metal foil of the above-described insulation material with metal foil by thermocompression bonding.

An embodiment of the present invention also relates to a method of producing a circuit board, which comprises bonding the above-described insulation material with metal foil to a circuit board having a desired circuit pattern by thermocompression bonding, thereby forming an insulating layer.

An embodiment of the present invention also relates to a method of producing a film, which comprises removing the plastic film carrier from the above-described film, disposing a metal foil on both sides of the insulation material and bonding the metal foil by thermocompression bonding.

An embodiment of the present invention also relates to a method of producing a circuit board, which comprises removing the plastic film carrier from the above-described film, disposing a circuit board having a desired circuit pattern on both sides of the insulation material and bonding the circuit board by thermocompression bonding, thereby forming an insulating layer.

An embodiment of the present invention also relates to a method of producing a circuit board, which comprises removing the plastic film carrier from the above-described film, disposing a circuit board having a desired circuit pattern on one side of the insulation material, disposing a conductive metal foil on the other side of the insulation material and bonding the conductive metal foil by thermocompression bonding.

An embodiment of the present invention also relates to a method of producing a circuit board, which comprises removing the plastic film carrier from the above-described film and bonding the film to a circuit board having a desired circuit pattern by thermocompression bonding, or removing the plastic film carrier after the film is bonded to a circuit board having a desired circuit pattern by thermocompression bonding, and forming a conductor on the insulation material by conductive plating, sputtering of a conductive material or application of a conductive paint.

An embodiment of the present invention also relates to a method of producing a circuit board, which comprises forming a conductor on a film formed on a circuit board by conductive plating, sputtering of a conductive material or application of a conductive paint.

According to the first embodiment, since two fillers are combined, high volume filling of filler can be achieved and the dielectric constant of an insulation material can be increased. Because a filler having a small particle size can be used, thinning of high dielectric constant insulation material can be achieved. The first embodiment can also provide an insulating varnish with high dielectric constant excellent in handling properties and a multi-layered printed wiring board in which the insulating varnish is used.

According to the second embodiment, an insulating varnish with high dielectric constant excellent in handling properties and a multi-layered printed wiring board in which the insulating varnish is used can be provided.

According to the third embodiment, an insulating varnish with high dielectric constant excellent in reliability and a multi-layered printed wiring board in which the insulating varnish is used can be provided. The reliability herein mentioned is an index of insulation deterioration of an insulation material. Generally, insulation materials used for wiring boards are previously subjected to insulation reliability evaluation in order to avoid occurrence of insulation deterioration upon practical use. This evaluation is performed, for example, by an accelerated test in which the material is kept at a high temperature high humidity condition of 85° C. and 85% RH and a given voltage is applied to the material. This accelerated test makes it possible to estimate the insulation deterioration upon practical use in a short time.

The present specification describes subject matters included in Japanese Patent Application Nos. 2003-140704 (filed May 19, 2003), 2003-140714 (filed May 19, 2003) and 2003-162001 (filed Jun. 6, 2003), which are comprehensively incorporated into the present specification by reference.

BEST MODE FOR CARRYING OUT THE INVENTION (Filler)

As the filler having a dielectric constant of 50 or more used in the first and third embodiments, for example, at least one filler selected from the group consisting of barium titanate, strontium titanate, potassium titanate, magnesium titanate, lead titanate, titanium dioxide, barium zirconate, calcium zirconate and lead zirconate can be used. These fillers may be granular or spherical.

It is essential in the first embodiment to use a filler having two peaks in different particle size ranges in a particle size distribution, and such filler may also be used in the second embodiment for efficient filling of the filler. Referring to the particle size of the filler, two fillers having different particle sizes at a cumulative percentage of 50% may be used. Regarding the particle size at a cumulative percentage of 50% of the two fillers, a filler having a particle size of 1 to 5 μm at a cumulative percentage of 50% is preferably used as the first filler. One or at least two fillers in combination may be used as the first filler. Further, this filler preferably accounts for 50% by weight or more of the total amount of the fillers. As the second filler, a filler having a particle size of 0.01 to 1 μm at a cumulative percentage of 50% is preferably used. One or at least two fillers in combination may be used as the second filler. The second filler is mixed to the first filler so that the total is 100% by weight. The first filler and the second filler may be combined so that the particle size at a cumulative percentage of 50% falls into the range of 1 to 3 μm when the first filler and the second filler are mixed. When the particle size at a cumulative percentage of 50% is smaller than 1 μm, the viscosity of varnish tends to be increased. When the particle size at a cumulative percentage of 50% is larger than 3 μm, insulation failure may be more likely to be caused upon thinning of composite materials.

As the filler used in the second embodiment of the present invention, at least one filler selected from the group consisting of barium titanate, strontium titanate, potassium titanate, magnesium titanate, lead titanate, titanium dioxide, barium zirconate, calcium zirconate and lead zirconate may be used. These fillers may be granular or spherical.

The filler used in the second embodiment of the present invention has a particle size of preferably 0.01 to 10 μm, more preferably 0.01 to 5 μm. Two or more fillers having different average particle sizes may also be used. When the particle size of the filler is smaller than 0.01 μm, the viscosity of varnish tends to be increased. When the particle size is larger than 10 μm, thinning of composite materials may be difficult.

In all embodiments, it is preferred that the content of the filler is adjusted to 30 to 90 parts by volume based on 100 parts by volume of an insulation material. When the content is 30 parts by volume or lower, the effect of increasing dielectric constant is small. When the content is 90 parts by volume or higher, voids are generated and reliability and dielectric constant may be decreased.

(Insulating Resin)

The insulating resin contains a high molecular weight component having a weight average molecular weight of 10000 or more and capable of forming a film and a thermosetting resin component, and may additionally contain a curing agent, a curing accelerator, a coupling agent and a diluent.

As the insulating resin used in the present invention, conventional resins used for prepregs in which glass cloth is used as a substrate and thermosetting resins used for adhesive films in which no glass cloth substrate is used or adhesive films with copper foil may be used.

(High Molecular Weight Component)

Regarding the high molecular weight component having a weight average molecular weight of 10000 or more, useful are components that can form a film when they are applied to a material in the form of a film and dried. As the high molecular weight component capable of forming a film, for example, at least one component selected from the group consisting of phenoxy resins, polyamideimide resins, polyacrylonitrile resins, polyphenyleneoxide resins and polyacrylonitrile butadiene resins may be used. Of these, phenoxy resins, polyamideimide resins and polyacrylonitrile-butadiene resins which are compatible with an epoxy resin are preferred. Examples of phenoxy resins include phenoxy resins, flame retarded brominated phenoxy resins and cyanoethylated phenoxy resins. Examples of polyamideimide resins include polyamideimide resins and Si-containing polyamideimide resins.

The proportion of the above-described high molecular weight component is preferably 5 to 95% by weight in the insulating resin. When the proportion is lower than 5% by weight, the composite material has insufficient film formability and so handling properties are deteriorated. When the proportion is higher 95% by weight, operationability may be poor due to increased viscosity.

(Thermosetting Component)

The thermosetting resin used in the present invention may be a resin that has adhesive action upon curing. As thermosetting resin, for example, epoxy resins, bis-triazine resin, polyimide resins, phenol resins, melamine resins, silicon resins, unsaturated polyester resins, cyanate ester resins, isocyanate resins, polyimide resins and various modified resins thereof are preferred. Of these, bis-triazine resins and epoxy resins are particularly preferred in view of properties of printed wiring boards.

Preferred examples of epoxy resins include bisphenol A epoxy resins, bisphenol F epoxy resins, bisphenol S epoxy resins, phenol novolac epoxy resins, cresol novolac epoxy resins, bisphenol A novolac epoxy resins, salicylaldehyde novolac epoxy resins, bisphenol F novolac epoxy resins, alicyclic epoxy resins, glycidyl ester epoxy resins, glycidyl amine epoxy resins, hydantoin epoxy resins, isocyanurate epoxy resins, aliphatic cyclic epoxy resins, halogenated or hydrogenated products thereof and mixtures of these resins. Of these, bisphenol A novolac epoxy resins and salicylaldehyde novolac epoxy resins are preferred because they are excellent in heat resistance.

(Curing Agent)

As a curing agent for such resin, a conventionally used agent may be used. In the case of an epoxy resin, for example, dicyandiamide, compounds having two or more phenol hydroxyl groups in a molecule, i.e., bisphenol A resins, bisphenol F resins, phenol novolac resins, bisphenol novolac resins, cresol novolac resins, salicylaldehyde novolac epoxy resins, halogenated or hydrogenated products of these phenol resins and compounds containing a triazine structure may be used. These curing agents may be used alone or in a combination of two or more.

The proportion of the curing agent relative to the aforementioned resin may be a proportion conventionally employed, and preferred is a hydroxyl group equivalent in the range of 0.5 to 2.0 equivalents based on epoxy equivalent. In the case of dicyandiamide, the proportion is preferably in the range of 2 to 5 parts by weight based on 100 parts by weight of the resin.

(Curing Accelerator)

As a curing accelerator, an imidazole compound, an organic phosphorous compound, a tertiary amine or a quaternary ammonium salt may be used in the case of an epoxy resin.

The proportion of the curing accelerator relative to the aforementioned resin may be a proportion conventionally employed, and is in the range of preferably 0.001 to 10 parts by weight, more preferably 0.01 to 1.0 part by weight based on 100 parts by weight of the resin. When the proportion of the curing accelerator is less than 0.001 part by weight, curing tends to be insufficient, and when the proportion is more than 10 parts by weight, the prepared varnish may have a shorter pot life and the costs may be increased.

(Diluent)

It is desired that the composite material of the present invention is diluted with a solvent and used as resin varnish. As the solvent, for example, acetone, methyl ethyl ketone, toluene, xylene, methyl isobutyl ketone, ethyl acetate, ethylene glycol monomethyl ether, methanol, ethanol, N,N-dimethylformamide and N,N-dimethylacetamide may be used.

The proportion of the diluent relative to the aforementioned resin is in the range of preferably 1 to 200 parts by weight, more preferably 5 to 100 parts by weight based on 100 parts by weight of the composite material. When the proportion of the diluent is less than 1 part by weight, handling properties may be poor, and when the proportion is more than 200 parts by weight, operationability may be poor.

(Other agents)

In the present invention, in addition to the components described above, a conventionally known coupling agent or ion scavenger may be appropriately added to the resin according to need.

(Dispersant)

To disperse multiple fillers, a dispersant is used. Examples of such dispersant include those containing a carboxylic group in their component. Additional examples of dispersant include polymers containing one or more carboxylic groups.

Examples of commercially available dispersants containing a carboxylic group include DISPARLON 2150 (available from Kusumoto Chemicals, Ltd., product name), HOMOGENOL L-18 and HOMOGENOL L-1820 (available from KAO CORPORATION, product name).

The dispersant is used in a proportion of preferably 0.001 to 8% by weight, particularly preferably 0.005 to 5% by weight based on the weight of the filler.

The dispersant has a great influence on the pH of an extract after curing. Thus, by selecting a dispersant from which an acid component is difficult to be extracted after curing of resin, the pH of the extract can be easily adjusted to an appropriate value. A dispersant whose acid component is incorporated into a resin is preferred, and carboxylic acid dispersants such as carboxylic acid-containing polymer and polycarboxylic acid are particularly preferred. Or, dispersants whose acid component is relatively easily soluble in water after curing, such as polymer dispersants containing another acid group, may also be used as long as the pH of the extract is 6 or more.

(Kneading Method)

To improve dispersibility of the filler, it is preferable to perform kneading using a stone mill, a three roll mill, a bead mill or a sand mill in combination after preparing varnish by mixing two fillers, an insulating resin and a diluent, because agglomeration of particles can be reduced. Alternatively, it is also possible to disperse a filler using an apparatus equipped with an ultrasonic oscillator. It is desired that bubbles in varnish are removed after kneading by allowing the resultant to stand under reduced pressure or by defoaming with stirring under reduced pressure.

(Carrier Film)

In the present invention, when forming an insulation material (in B-stage) on a carrier film, conductive metal foil such as copper foil and aluminum foil and a film of which the conductive metal foil applied surface is roughened for improving adhesiveness may be used as a carrier film. In addition, plastic films such as polyester films and polyimide films may be used. Further, those obtained by treating the surface of the aforementioned metal foil or film by a release agent may also be used.

(Application Method)

Regarding the method of applying a composite material to a carrier film, conventionally used methods may be employed as long as the composite material can be applied to the film in a desired thickness. It is more preferable to use an apparatus equipped with a heat dryer that can remove solvent in the resin varnish and semi-cure the thermosetting component of the resin, because operationability can be improved. Application means such as a blade coater, a rod coater, a knife coater, a squeeze coater, a reverse roll coater, a transfer roll coater, a comma coater, a gravure coater and a die coater may be employed.

(Thickness of Insulating Layer)

The insulating layer preferably has a thickness of 3 to 100 μm. When the insulating layer is thicker than 100 μm, the capacitance to be obtained may be decreased when used as a dielectric of a capacitor. When the layer is thinner than 3 μm, a uniform coated film may not be obtained. The insulating layer more preferably has a thickness of 10 to 100 μm. A thickness of the insulating layer of 10 μm or thicker helps ensure insulation reliability.

(Fabrication of Circuit Board)

An insulation material with conductive metal foil may be formed on a substrate having a desired circuit pattern by thermocompression bonding so as to use the insulation material as an insulating layer of a circuit board. Also, an insulation material with a plastic carrier may be bonded to a substrate by thermocompression bonding. In the case of thermosetting insulating resin, it is desirable to heat cure the resin upon thermocompression bonding or in another step, because properties such as heat resistance, adhesiveness and glass transition temperature are improved. For thermocompression bonding, conventionally used methods may be employed, and press lamination, vacuum press lamination, roll lamination, batch press or the like is applicable.

Also, insulating varnish may be directly applied to a substrate and dried by heating to form an insulating layer.

The insulation material according to the third embodiment is prepared so that the extract of the insulation material with water has a pH of 6 or higher. This makes it possible to produce a material excellent in insulation reliability. Herein, extract with water means an aqueous solution obtained by keeping a cured insulation material and water in a sealed pressure vessel in a thermostatic chamber at 120° C. for 20 hours. The pH of the extract may be controlled by selection or mixing of dispersant used for an insulation material. The pH of the extract is preferably not higher than 9.

In the following, Examples of the first embodiment are described, but the present invention is not limited to the following Examples.

Example A-1

To 10 parts by weight of phenoxy resin (YP-50 available from Tohto Kasei Co., Ltd., weight average molecular weight 59,000) were added, as epoxy resins, 27 parts by weight of bisphenol A epoxy resin (YD-8125 available from Tohto Kasei Co., Ltd., epoxy equivalent 175) and 13 parts by weight of ortho-cresol novolac epoxy resin (YDCN703 available from Tohto Kasei Co., Ltd., epoxy equivalent 210). Thereto was added a composition containing 25 parts by weight of bisphenol A novolac phenol resin (LF-2882 available from DAINIPPON INK AND CHEMICALS, INC., hydroxyl group equivalent 118) as a curing agent, 0.3 part by weight of 1-cyanoethyl-2-phenylimidazole (2PZ-CN available from SHIKOKU CHEMICALS CORPORATION) as a curing accelerator and 7 parts by weight of phosphoric ester polymer (W9010 available from BYK-CHEMIE, solid content 50% by weight) as a filler dispersant, and methyl ethyl ketone was added thereto to prepare a varnish of 35% by weight.

To the obtained varnish were added 220 parts by weight of barium titanate having a particle size of 1.5 μm at a cumulative percentage of 50% (BT-100PR available from FUJI TITANIUM INDUSTRY CO. LTD., dielectric constant 1,500) and 55 parts by weight of barium titanate having a particle size of 0.6 μm at a cumulative percentage of 50% (HPBT-1 available from FUJI TITANIUM INDUSTRY CO. LTD., dielectric constant 1,500). The mixture was then kneaded using a bead mill and filtrated through a nylon mesh with a mesh opening of 70 μm to prepare a filler composite varnish.

Example A-2

To 40 parts by weight of siloxane modified polyamideimide resin (available from Hitachi Chemical Co., Ltd., weight average molecular weight 50,000) was added 12 parts by weight of bisphenol A epoxy resin (YD-8125 available from Tohto Kasei Co., Ltd., epoxy equivalent 175) as an epoxy resin. Thereto was added a composition containing 2.4 parts by weight of ortho-cresol novolac phenol resin (KA-1160 available from DAINIPPON INK AND CHEMICALS, INC., hydroxyl group equivalent 119) as a curing agent, 0.1 part by weight of 1-cyanoethyl-2-phenylimidazole (2PZ-CN available from SHIKOKU CHEMICALS CORPORATION) as a curing accelerator and 5 parts by weight of phosphoric ester polymer (W9010 available from BYK-CHEMIE, solid content 50% by weight) as a filler dispersant, and methyl ethyl ketone was added thereto to prepare a varnish of 35% by weight.

To the obtained varnish were added 160 parts by weight of barium titanate having a particle size of 1.5 μm at a cumulative percentage of 50% (BT-100PR available from FUJI TITANIUM INDUSTRY CO. LTD., dielectric constant 1,500) and 40 parts by weight of barium titanate having a particle size of 0.6 μm at a cumulative percentage of 50% (HPBT-1 available from FUJI TITANIUM INDUSTRY CO. LTD., dielectric constant 1,500). The mixture was then kneaded using a bead mill and filtrated through a nylon mesh with a mesh opening of 70 μm to prepare a filler composite varnish.

Example A-3

A filler composite varnish was prepared in the same manner as in Example A-1 except that, of the inorganic fillers, the barium titanate having a particle size of 0.6 μm at a cumulative percentage of 50% was changed to 55 parts by weight of titanium dioxide having a particle size of 0.6 μm at a cumulative percentage of 50% (TM-1 available from FUJI TITANIUM INDUSTRY CO. LTD., dielectric constant 96).

Example A-4

A filler composite varnish was prepared in the same manner as in Example A-2 except that, of the inorganic fillers, the barium titanate having a particle size of 0.6 μm at a cumulative percentage of 50% was changed to 55 parts by weight of titanium dioxide having a particle size of 0.6 μm at a cumulative percentage of 50% (TM-1 available from FUJI TITANIUM INDUSTRY CO. LTD., dielectric constant 96).

Reference Example A-1

A filler composite varnish was prepared in the same manner as in Example A-1 except that, of the inorganic fillers, the barium titanate having a particle size of 1.5 μm at a cumulative percentage of 50% was not used, but 275 parts by weight of barium titanate having a particle size of 0.6 μm at a cumulative percentage of 50% (HPBT-1 available from FUJI TITANIUM INDUSTRY CO. LTD. dielectric constant 1,500) was used.

Reference Example A-2

A filler composite varnish was prepared in the same manner as in Example A-1 except that, of the inorganic fillers, the barium titanate having a particle size of 0.6 μm at a cumulative percentage of 50% was not used, but 275 parts by weight of barium titanate having a particle size of 1.5 μm at a cumulative percentage of 50% (BT-100PR available from FUJI TITANIUM INDUSTRY CO. LTD., dielectric constant 1,500) was used.

Examples A-5 to 8

The varnish prepared in Examples A-1 to 4 was each applied to and cast on a 12-μm thick copper foil by a comma coater, and dried by heating at 130° C. for 2 minutes to remove the solvent and semi-cure the resin, whereby an insulation material with copper foil of which the insulating layer was 20 μm in thickness was prepared.

Reference Example A-4

Although it was attempted to apply the varnish prepared in Reference Example A-1 to a copper foil, formation of insulating layer of uniform thickness was difficult because of the high thixotropic properties.

Reference Example A-5

The varnish prepared in Reference Example 2 was each applied to and cast on a 12-μm thick copper foil by a comma coater, and dried by heating at 130° C. for 2 minutes to remove the solvent and semi-cure the resin, whereby an insulation material with copper foil of which the insulating layer was 20 μm in thickness was prepared.

(B-Stage Film Handling Properties)

Regarding handling properties, those that were neatly cut by a cutter knife without generating fragments of resin or had no blocking between insulation materials were rated as "G", and the rest were rated as "N".

(Evaluation of Dielectric Properties)

The insulation materials with copper foil of which the insulating layer was 20 μm in thickness prepared in Examples A-5 to 8 and Reference Example A-5 were each laminated so that the insulating layers are faced with each other, and bonded by thermocompression bonding and cured under conditions of a temperature increase rate of 5° C./minute, a curing temperature of 180° C., a curing time of 60 minutes, a pressure of 2.5 MPa and a vacuum of 5.3 kPa or lower. After molding, φ 20 mm pattern was formed on one side of the copper foils by etching and dielectric properties were evaluated using an LCR meter.

(Evaluation of Resistance to Soldering)

The insulation material with copper foil of which the insulating layer was 20 μm in thickness prepared in Example A-5 to 8 and Reference Example A-5 was each applied to a copper-clad laminate (MCL-E-679 available from Hitachi Chemical Co., Ltd.) which was subjected to adhesion treatment, and bonded by thermocompression bonding and cured under conditions of a temperature increase rate of 5° C./minute, a curing temperature of 180° C., a curing time of 60 minutes, a pressure of 2.5 MPa and a vacuum of 5.3 kPa or lower. The test piece after molding was cut into a size of 25 mm×25 mm to give a test piece for soldering resistance. The test piece was floated in a soldering bath at 260° C. for 2 minutes, and those which had no defect were rated as "G" and those which had a defect such as swelling of copper foil outer layer were rated as "N".

TABLE 1

| Items | Ex. | | | | Ref. Ex. | |
|---|---|---|---|---|---|---|
|  | A-5 | A-6 | A-7 | A-8 | A-4 | A-5 |
| Handling properties | G | G | G | G | Preparation impossible | G |
| Dielectric constant (@1 MHz) | 45 | 45 | 40 | 40 | — | 40 |
| Dissipation factor (@1 MHz) | 0.02 | 0.02 | 0.02 | 0.02 | — | 0.02 |
| Resistance to soldering | G | G | G | G | — | N |

In Examples A-5 to 8, high dielectric constant is achieved without deterioration of properties of a laminate in contrast to Reference Examples. In Reference Example A-5, although the same amount of barium titanate having the same dielectric constant as that of Examples A-5 and 6 was dispersed, increase in dielectric constant was small, and in addition, resistance to soldering was decreased. These seem to be because, due to use of a filler having a single particle size, dispersibility was decreased and voids were thus generated in the material.

In the following, Examples of the second embodiment are described, but the present invention is not limited to the following Examples.

Example B-1

To 10 parts by weight of phenoxy resin (YP-50 available from Tohto Kasei Co., Ltd., weight average molecular weight 59,000) were added, as epoxy resins, 27 parts by weight of bisphenol A epoxy resin (YD-8125 available from Tohto Kasei Co., Ltd., epoxy equivalent 175) and 13 parts by weight of ortho-cresol novolac epoxy resin (YDCN703 available from Tohto Kasei Co., Ltd., epoxy equivalent 210). Thereto was added a composition containing 25 parts by weight of bisphenol A novolac phenol resin (LF-2882 available from DAINIPPON INK AND CHEMICALS, INC., hydroxyl group equivalent 118) as a curing agent, 0.3 part by weight of 1-cyanoethyl-2-phenylimidazole (2PZ-CN available from SHIKOKU CHEMICALS CORPORATION) as a curing accelerator and 7 parts by weight of HOMOGENOL L-18 (special polycarboxylic acid surfactant available from KAO CORPORATION, solid content 40% by weight) as a filler dispersant, and methyl ethyl ketone was added thereto to prepare a varnish of 35% by weight.

To the obtained varnish were added 220 parts by weight of barium titanate having an average particle size of 1.5 μm (BT-100PR available from FUJI TITANIUM INDUSTRY CO. LTD., dielectric constant 1,500) and 55 parts by weight of barium titanate having an average particle size of 0.6 μm (HPBT-1 available from FUJI TITANIUM INDUSTRY CO. LTD., dielectric constant 1,500). The mixture was then kneaded using a bead mill and filtrated through a nylon mesh with a mesh opening of 70 μm to prepare a filler composite varnish.

Example B-2

A filler composite varnish was prepared in the same manner as in Example B-1 except that 14 parts by weight of HOMOGENOL L-1820 (special carboxylic acid polymer available from KAO CORPORATION, solid content 20%) was used as a dispersant instead of HOMOGENOL L-18.

Example B-3

A filler composite varnish was prepared in the same manner as in Example B-1 except that 5.6 parts by weight of DISPARLON 2150 (aliphatic polycarboxylic acid available from Kusumoto Chemicals, Ltd., solid content 50%) was used as a dispersant instead of HOMOGENOL L-18.

Reference Example B-1

A filler composite varnish was prepared in the same manner as in Example B-1 except that 5.6 parts by weight of W9010 (phosphoric ester polymer available from BYK-CHEMIE, solid content 50%) was used as a dispersant instead of HOMOGENOL L-18.

Reference Example B-2

A filler composite varnish was prepared in the same manner as in Example B-1 except that the dispersant W9010 was not used.

Examples B-4 to 6

The varnish prepared in Examples B-1 to 3 was applied to and cast on a 12-μm thick copper foil by a comma coater, and dried by heating at 130° C. for 2 minutes to remove the solvent and semi-cure the resin, whereby an insulation material with copper foil of which the insulating layer was 20 μm in thickness was prepared.

Reference Examples B-3 to 4

The varnish prepared in Reference Examples B-1 and 2 was each applied to copper foil in the same manner as in Examples 4 to 6 to prepare an insulation material with copper foil of which the insulating layer was 20 μm in thickness.

The prepared insulation materials were subjected to evaluation of the following items.

(Evaluation of Dielectric Properties)

Dielectric properties were measured by the same method as in the Examples of the first embodiment.

(Evaluation of Resistance to Soldering)

Resistance to soldering was measured by the same method as in the Examples of the first embodiment.

(Evaluation of Insulation Reliability)

The insulation material with copper foil of which the insulating layer was 20 μm in thickness prepared in Examples B-4 to 6 and Reference Examples B-3 and 4 was each applied to a copper-clad laminate (MCL-E-679 available from Hitachi Chemical Co., Ltd.) which was subjected to adhesion treatment, and bonded by thermocompression bonding and cured under conditions of a temperature increase rate of 5° C./minute, a curing temperature of 180° C., a curing time of 60 minutes, a pressure of 2.5 MPa and a vacuum of 5.3 kPa or lower. Using the test piece after molding, insulation reliability in the thickness direction of the insulating resin present between outer layer copper and inner layer copper was tested. The test condition was 85° C. and 85% RH, and the test was performed at an applied voltage of 6 DCV. Those having an insulation resistance after 1,000 hours of $10^7$ Ω or more and having no appearance defect on copper foil were rated as "G" and the rest were rated as "N".

TABLE 2

| Items | Ex. | | | Ref. Ex. | |
|---|---|---|---|---|---|
| | B-4 | B-5 | B-6 | B-3 | B-4 |
| Dielectric constant (@1 MHz) | 45 | 45 | 45 | 45 | 40 |
| Dissipation factor (@1 MHz) | 0.02 | 0.02 | 0.02 | 0.02 | 0.02 |
| Resistance to soldering | G | G | G | G | N |
| Insulation reliability | G | G | G | N | N |

The above results suggest the following.

In Examples B-4 to 6, high dielectric constant is achieved without deterioration of properties of a laminate in contrast to Reference Examples. In addition, they have excellent insulation reliability despite the high volume filling of filler. In Reference Example B-3, insulation reliability was decreased although the same amount of barium titanate having the same dielectric constant as that of Examples B-4 to 6 was dispersed. Reference Example B-4 was performed under the same conditions as in Examples B-4 to 6 except that the dispersant was not used, but there were decrease in dielectric constant, decrease in heat resistance and decrease in insulation reliability. This seems to be because no dispersant was used.

Thus, the insulation materials of these Examples can effectively improve dielectric constant when high dielectric constant filler is combined with insulating resin. Further, since these materials have properties of an insulation material, they are suitable as a material of a capacitor embedded in a substrate.

In the insulation materials of these Examples, high dielectric constant can be effectively achieved, and an insulating layer using the same is excellent in insulation reliability even if the insulating layer is thin, and thus is useful as a dielectric of a capacitor embedded in a substrate.

In the following, Examples of the third embodiment are described, but the present invention is not limited to the following Examples.

Example C-1

To 10 parts by weight of phenoxy resin (YP-50 available from Tohto Kasei Co., Ltd., weight average molecular weight 59,000) were added, as epoxy resins, 27 parts by weight of bisphenol A epoxy resin (YD-8125 available from Tohto Kasei Co., Ltd., epoxy equivalent 175) and 13 parts by weight of ortho-cresol novolac epoxy resin (YDCN703 available from Tohto Kasei Co., Ltd., epoxy equivalent 210). Thereto was added a composition containing 25 parts by weight of bisphenol A novolac phenol resin (LF-2882 available from DAINIPPON INK AND CHEMICALS, INC., hydroxyl group equivalent 118) as a curing agent, 0.3 part by weight of 1-cyanoethyl-2-phenylimidazole (2PZ-CN available from SHIKOKU CHEMICALS CORPORATION) as a curing accelerator and 7 parts by weight of HOMOGENOL L-18 (special polycarboxylic acid surfactant available from KAO CORPORATION, solid content 40% by weight) as a filler dispersant, and methyl ethyl ketone was added thereto to prepare a varnish of 35% by weight.

To the obtained varnish were added 220 parts by weight of barium titanate having an average particle size of 1.5 μm (BT-100PR available from FUJI TITANIUM INDUSTRY CO. LTD., dielectric constant 1,500) and 55 parts by weight of barium titanate having an average particle size of 0.6 μm (HPBT-1 available from FUJI TITANIUM INDUSTRY CO. LTD., dielectric constant 1,500). The mixture was then kneaded using a bead mill and filtrated through a nylon mesh with a mesh opening of 70 μm to prepare a filler composite varnish.

Example C-2

A filler composite varnish was prepared in the same manner as in Example C-1 except that 14 parts by weight of HOMOGENOL L-1820 (special carboxylic acid polymer available from KAO CORPORATION, solid content 20%) was used as a dispersant instead of HOMOGENOL L-18.

Example C-3

A filler composite varnish was prepared in the same manner as in Example C-1 except that 5.6 parts by weight of DISPARLON 2150 (aliphatic polycarboxylic acid available from Kusumoto Chemicals, Ltd., solid content 50%) was used as a dispersant instead of HOMOGENOL L-18.

Reference Example C-1

A filler composite varnish was prepared in the same manner as in Example C-1 except that 5 parts by weight of W9010

(phosphoric ester polymer available from BYK-CHEMIE, solid content 50%) was used as a dispersant instead of HOMOGENOL L-18.

Reference Example C-2

A filler composite varnish was prepared in the same manner as in Example C-1 except that 10 parts by weight of Disperbyk-110 (polymer containing acid group available from BYK-CHEMIE, solid content 50% by weight) as a dispersant instead of HOMOGENOL L-18.

Examples C-4 to 6

The varnish prepared in Examples C-1 to 3 was each applied to and cast on a 12-μm thick copper foil by a comma coater, and dried by heating at 130° C. for 2 minutes to remove the solvent and semi-cure the resin, whereby an insulation material with copper foil of which the insulating layer was 20 μm in thickness was prepared.

Reference Examples C-3 to 4

The varnish prepared in Reference Examples C-1 and 2 was each applied to copper foil in the same manner as in Examples C-4 to 6 to prepare an insulation material with copper foil of which the insulating layer was 20 μm in thickness.

The prepared insulation materials were subjected to evaluation of the following items.

(B-Stage Film Handling Properties)

Regarding handling properties, those that were neatly cut by a cutter knife without generating fragments of resin or had no blocking between insulation materials were rated as "G", and the rest were rated as "N".

(Evaluation of Dielectric Properties)

Dielectric properties were measured by the same method as in the Examples of the first embodiment.

(Evaluation of Resistance to Soldering)

Resistance to soldering was measured by the same method as in the Examples of the first embodiment.

(Preparation and Evaluation of Extract)

The insulation materials with copper foil of which the insulating layer was 20 μm in thickness prepared in Examples C-4 to 6 and Reference Examples C-3 to 4 were each arranged so that the resin layers were faced with each other, and bonded by thermocompression bonding and cured under conditions of a temperature increase rate of 5° C./minute, a curing temperature of 180° C., a curing time of 60 minutes, a pressure of 2.5 MPa and a vacuum of 5.3 kPa or lower. The copper foil of the test piece after molding was removed by etching, and after sufficiently rinsing off the etching solution, the test piece was dried to give a cure product.

40 g of distilled water and 0.4 g of the above-described cured product were weighed and put in a teflon pot equipped with a pressure tight stainless steel jacket (made by FLON INDUSTRY CO. LTD.), and the pot was sealed while the cured product was dipped in distilled water. The pressure vessel was then placed in a thermostatic chamber at 120° C. for 20 hours to perform extraction.

The pH of the extract was measured at room temperature using pH meter HM-40S made by TOA Electronics, LTD.

(Insulation Reliability)

The insulation material with copper foil of which the insulating layer was 20 μm in thickness prepared in Examples C-4 to 6 and Reference Examples C-3 and 4 was each applied to a copper-clad laminate (MCL-E-679 available from Hitachi Chemical Co., Ltd.) which was subjected to adhesion treatment, and bonded by thermocompression bonding and cured under conditions of a temperature increase rate of 5° C./minute, a curing temperature of 180° C., a curing time of 60 minutes, a pressure of 2.5 MPa and a vacuum of 5.3 kPa or lower. Using the test piece after molding, insulation reliability in the thickness direction of the insulating resin present between outer layer copper and inner layer copper was tested. The test condition was 85° C. and 85% RH, and the test was performed at an applied voltage of 6 DCV. Those having an insulation resistance after 1,000 hours of $10^9$ Ω or more were rated as "G" and the rest were rated as "N".

TABLE 3

|  | Ex. C-4 | Ex. C-5 | Ex. C-6 | Ref. Ex. C-3 | Ref. Ex. C-4 |
|---|---|---|---|---|---|
| Handling properties | G | G | G | G | G |
| Dielectric constant (@1 MHz) | 45 | 45 | 45 | 45 | 45 |
| Dissipation factor (@1 MHz) | 0.02 | 0.02 | 0.02 | 0.02 | 0.02 |
| Resistance to soldering | G | G | G | G | G |
| pH of extract | 7.5 | 7.2 | 7.4 | 5 | 5.6 |
| Insulation reliability | G | G | G | N | N |

The above-described results suggest the following.

The materials of Examples C-4 to 6 whose extract had a pH of 6 or higher had excellent insulation reliability. On the contrary, in Reference Examples C-3 and 4, the pH of the extract was lower than 6, and the material had poor insulation reliability.

Thus, in these Examples, when an extract of an insulation material has a pH of 6 or higher, the insulation material has excellent insulation reliability even when high dielectric constant filler is combined with insulating resin and the insulating layer is thin. An insulation material obtained by using the insulating varnish of these Examples is a high dielectric constant material excellent in insulation reliability, and an insulating layer using the same is suitable as a dielectric of a capacitor embedded in a substrate.

As described above, these Examples can provide an insulating varnish having high dielectric constant and excellent in reliability and a multi-layered printed wiring board in which the insulating varnish is used.

It should be understood by those skilled in the art that the above description includes preferred embodiments of the present invention and various changes and modifications thereof can be made as long as there is no departure from the spirit and the scope of the present invention.

The invention claimed is:

1. An insulation material which has a dielectric constant of 10 or more, and which comprises
    a filler having a dielectric constant of 50 or more and having two peaks in different particle size ranges in a particle size distribution,
    an insulating resin, and
    a dispersant,
    wherein they are combined with each other, and wherein the filler having a dielectric constant of 50 or more contains a filler having a dielectric constant of 50 or more and a particle size of 1 to 5 μm at a cumulative percentage of 50% and a filler having a dielectric constant of 50 or more and a particle size of 0.01 to 1 μm at a cumulative percentage of 50%.

2. The insulation material according to claim 1, which contains 30 to 90 parts by volume of the filler having a dielectric constant of 50 or more based on 100 parts by volume of the insulation material.

3. The insulation material according to claim 1, wherein the filler having a dielectric constant of 50 or more is at least one member selected from the group consisting of barium titanate, strontium titanate, potassium titanate, magnesium titanate, lead titanate, titanium dioxide, barium zirconate, calcium zirconate and lead zirconate.

4. The insulation material according to claim 1, wherein the insulating resin contains a high molecular weight component having a weight average molecular weight of 10000 or more and capable of forming a film and a thermosetting component.

5. The insulation material according to claim 4, wherein the insulating resin contains 5 to 95% by weight of the high molecular weight component.

6. The insulation material according to claim 4, wherein the thermosetting component contains an epoxy resin and a phenol resin which is a curing agent thereof.

7. The insulation material according to claim 4, wherein the high molecular weight component is at least one component selected from the group consisting of a phenoxy resin, polyamideimide resin, polyacrylonitrile resin, polyphenyleneoxide resin and polyacrylonitrile butadiene resin.

8. A film bondable by thermocompression bonding comprising an insulation material according to claim 1 applied to a metal foil.

9. A film bondable by thermocompression bonding comprising an insulation material according to claim 4 applied to a metal foil and semi-cured.

10. A film bondable by thermocompression bonding comprising an insulation material according to claim 1 applied to a plastic film carrier.

11. A film bondable by thermocompression bonding comprising an insulation material according to claim 4 applied to a plastic film carrier and semi-cured.

12. A film comprising an insulation material according to claim 1 and a conductive layer on both sides of the insulation material.

13. A film comprising an insulation material according to claim 4 and a conductive layer on both sides of the insulation material, wherein the insulation material is cured.

14. A circuit board comprising an insulation material according to claim 1 as an insulating layer of 3 to 100 μm thickness.

15. A circuit board comprising an insulation material according to claim 1 as a thermosetting insulating layer of 3 to 100 μm thickness.

16. A method of producing a circuit board, which comprises applying an insulation material according to claim 1 to a circuit board, thereby forming an insulating layer.

17. A method of producing a circuit board, which comprises applying an insulation material according to claim 4 to a circuit board and thermosetting the insulation material, thereby forming an insulating layer.

18. A method of producing a film, which comprises bonding another metal foil to a resin surface, without a metal foil, of a film according to claim 8 by thermocompression bonding.

19. A method of producing a circuit board, which comprises bonding a film according to claim 8 to a circuit board having a desired circuit pattern by thermocompression bonding, thereby forming an insulating layer.

20. A method of producing a film, which comprises removing a plastic film carrier from a film according to claim 10, disposing a metal foil on both sides of an insulation material and bonding the metal foil by thermocompression bonding.

21. A method of producing a circuit board, which comprises removing a plastic film carrier from a film according to claim 10, disposing a circuit board having a desired circuit pattern on both sides of an insulation material and bonding the circuit board by thermocompression bonding, thereby forming an insulating layer.

22. A method of producing a circuit board, which comprises removing a plastic film carrier from a film according to claim 10, disposing a circuit board having a desired circuit pattern on one side of an insulation material, disposing a conductive metal foil on the other side of the insulation material and bonding the conductive metal foil by thermocompression bonding.

23. A method of producing a circuit board, which comprises
removing a plastic film carrier from a film according to claim 10 and bonding the film to a circuit board having a desired circuit pattern by thermocompression bonding, or removing a plastic film carrier after the film is bonded to a circuit board having a desired circuit pattern by thermocompression bonding, and
forming a conductor on an insulation material by conductive plating, sputtering of a conductive material or application of a conductive paint.

24. A method of producing a circuit board, which comprises forming a conductor on a film according to claim 12 formed on a circuit board by conductive plating, sputtering of a conductive material or application of a conductive paint.

25. The insulation material according to claim 1, wherein the filler containing two kind of fillers with different particle size has a particle size of 1 to 3 μm at a cumulative percentage of 50%.

26. The insulation material according to claim 1, wherein the content of the dispersant is 0.001-8% by weight of the filler.

27. An insulation material which has a dielectric constant of 10 or more, and which comprises
a filler having a dielectric constant of 50 or more and having two peaks in different particle size ranges in a particle size distribution,
an insulating resin, and
a dispersant,
wherein they are combined with each other, and
wherein the filler having a dielectric constant of 50 or more contains, based on the total filler, 50% by weight or more of a filler having a dielectric constant of 50 or more and a particle size of 1 to 5 μm at a cumulative percentage of 50% and a remaining filler having a dielectric constant of 50 or more and a particle size of 0.01 to 1 μm at a cumulative percentage of 50%.

28. The insulation material according to claim 27, wherein the content of the dispersant is 0.001-8% by weight of the filler.

29. An insulation material having a dielectric constant of 10 or more comprising, as essential components, 1) at least one filler selected from the group consisting of barium titanate, strontium titanate, potassium titanate, magnesium titanate, lead titanate, titanium dioxide, barium zirconate, calcium zirconate and lead zirconate, 2) an insulating resin and 3) a dispersant containing a carboxylic group, wherein the dispersant containing a carboxylic group is a polymer containing a carboxylic group.

30. The insulation material according to claim 29, wherein the insulating resin contains a high molecular weight component having a weight average molecular weight of 10000 or more and capable of forming a film and a thermosetting component.

31. A film bondable by thermocompression bonding comprising an insulation material according to claim 29 applied to a metal foil.

32. A film bondable by thermocompression bonding comprising an insulation material according to claim 29 applied to a plastic film carrier.

33. A film comprising an insulation material according to claim 29 and a conductive layer on both sides of the insulation material.

34. A circuit board comprising an insulation material according to claim 29 as an insulating layer of 3 to 100 μm thickness.

35. A circuit board comprising an insulation material according to claim 29 as a thermosetting insulating layer of 3 to 100 μm thickness.

36. A method of producing a circuit board, which comprises applying an insulation material according to claim 29 to a circuit board, thereby forming an insulating layer.

37. The insulation material according to claim 29, wherein the at least one filler is selected from the group consisting of strontium titanate, potassium titanate, magnesium titanate, lead titanate, barium zirconate, calcium zirconate and lead zirconate.

38. The insulation material according to claim 29, wherein the polymer containing a carboxylic group is a copolymer containing a carboxylic group.

39. The insulation material according to claim 29, wherein the content of the dispersant is 0.001-8% by weight of the filler.

40. The insulation material according to claim 29, wherein the filler has a dielectric constant of 50 or more, wherein said dispersant disperses the filler, and
wherein an extract of a cured product of the insulation material obtained by extraction with water at 120° C. for 20 hours using a pressure vessel has a pH of 6 or higher.

41. The insulation material according to claim 40, which contains 30 to 90 parts by volume of the filler having a dielectric constant of 50 or more based on 100 parts by volume of the insulation material.

42. The insulation material according to claim 40, wherein the insulating resin contains a high molecular weight component having a weight average molecular weight of 10000 or more and capable of forming a film and a thermosetting component.

43. A film bondable by thermocompression bonding comprising an insulation material according to claim 40 applied to a metal foil.

44. A film bondable by thermocompression bonding comprising an insulation material according to claim 40 applied to a plastic film carrier.

45. A film comprising an insulation material according to claim 40 and a conductive layer on both sides of the insulation material.

46. A circuit board comprising an insulation material according to claim 40 as an insulating layer of 3 to 100 μm thickness.

47. A circuit board comprising an insulation material according to claim 40 as a thermosetting insulating layer of 3 to 100 μm thickness.

48. A method of producing a circuit board, which comprises applying an insulation material according to claim 40 to a circuit board, thereby forming an insulating layer.

49. The insulation material according to claim 40, wherein the content of the dispersant is 0.001-8% by weight of the filler.

* * * * *